United States Patent [19]

Hart

[11] 4,430,793
[45] Feb. 14, 1984

[54] METHOD OF MANUFACTURING A SEMICONDUCTOR DEVICE UTILIZING SELECTIVE INTRODUCTION OF A DOPANT THRU A DEPOSITED SEMICONDUCTOR CONTACT LAYER

[75] Inventor: Cornelis M. Hart, Sunnyvale, Calif.

[73] Assignee: U.S. Philips Corporation, Tarrytown, N.Y.

[21] Appl. No.: 111,401

[22] Filed: Jan. 11, 1980

[30] Foreign Application Priority Data

Jan. 15, 1979 [NL] Netherlands ................. 7900280

[51] Int. Cl.³ ................. H01L 21/20; H01L 21/225
[52] U.S. Cl. ................................. 29/578; 29/590; 29/591; 148/174; 148/175; 148/188; 357/34; 357/59; 357/65; 357/68; 427/85; 427/86
[58] Field of Search .................. 29/578, 590, 591; 148/174, 175, 188; 357/34, 59, 65, 68; 427/85, 86

[56] References Cited

U.S. PATENT DOCUMENTS

| | | | |
|---|---|---|---|
| 3,611,067 | 10/1971 | Oberlin et al. | 357/59 X |
| 4,063,901 | 12/1977 | Shiba | 148/188 X |
| 4,074,304 | 2/1978 | Shiba | 148/174 X |
| 4,161,745 | 7/1979 | Slob | 357/59 |
| 4,190,949 | 3/1980 | Ikeda et al. | 148/175 X |

OTHER PUBLICATIONS

Kemlage, B. M., "Prevention of Metal to Base Shorting", I.B.M. Tech. Discl. Bull., vol. 13, No. 5, Oct. 1970, pp. 1299–1300.

Primary Examiner—W. G. Saba
Attorney, Agent, or Firm—R. J. Meetin; R. T. Mayer; T. A. Briody

[57] ABSTRACT

A semiconductor device is fabricated by a process in which an aperture (4) is an insulating layer (3) along a surface (2) of a semiconductor body is utilized in defining the lateral extents of zones (6, 7, and 8) in a circuit element of the device. In particular, the insulating layer is first provided with the aperture along the surface. A semiconductor layer (5) is formed on the insulating layer, including the portion within the aperture. Using the edge of the insulating layer along the aperture as a masking edge, a pair of opposite-conductivity dopants are introduced selectively into the aperture and a third dopant is introduced through all of the aperture into the body. The third dopant may be introduced into the body before the semiconductor layer is formed.

14 Claims, 7 Drawing Figures

METHOD OF MANUFACTURING A SEMICONDUCTOR DEVICE UTILIZING SELECTIVE INTRODUCTION OF A DOPANT THRU A DEPOSITED SEMICONDUCTOR CONTACT LAYER

BACKGROUND OF THE INVENTION

1. Field of the Invention

The invention relates to a semiconductor device having a semiconductor substrate in which an electrically insulating layer having at least one aperture is present at a surface of the substrate and in which a semiconductor layer extends on the insulating layer and in the aperture and entirely covers the part of the surface of the substrate situated within the aperture, which device comprises a semiconductor circuit element having a first semiconductor zone of a first conductivity type, a second semiconductor zone of a second conductivity type, adjoining the first zone and a third semiconductor zone of the first conductivity type adjoining the second zone, the space within which the semiconductor zones of the circuit element can cooperate with each other being determined in the lateral direction by the edge of the aperture in the insulating layer and, taken from the surface of the semiconductor layer, the first zone being situated on the second and the second zone being situated on the third zone, a first part of the semiconductor layer situated on the insulating layer being of the first conductivity type, extending down to the aperture and, as a connection conductor, adjoining a part of the first zone situated within the edge of the aperture, a second part of the semiconductor layer situated on the insulating layer being of the second conductivity type, extending down to the aperture, and, as a connection conductor, adjoining a part of the second zone situated within the edge of the aperture.

The invention furthermore relates to a method of manufacturing such a device.

2. Description of the Prior Prior Art

A semiconductor device as described above is disclosed in published Netherlands Patent Application No. 76 12883, corresponding to U.S. Pat. No. 4,161,745. The transistor described therein has a small base zone and a small emitter zone in which two adjacent parts of the semiconductor layer which are of opposite conductivity types are used for the electric connection of the zones. The collector zone has an electric connection on the lower side of the semiconductor body or on the upper side via a second aperture in the insulating layer situated above the collector zone.

SUMMARY OF THE INVENTION

One of the objects of the present invention is to further improve said transistor and more in particular to provide a very small transistor for use in integrated circuits.

Another object of the invention is to provide very small circuit elements and/or combinations of circuit elements having at least three electric connections present on the upper side of the semiconductor body and which during their manufacture do not impose extra high requirements on the aligning tolerances.

A further object of the invention is to provide a method by means of which the new device can advantageously be manufactured.

According to the invention, a semiconductor device of the kind described in the opening paragraph is characterized in that the second zone situated on the third zone leaves a part of the third zone exposed within the edge of the aperture and a third part of the semiconductor layer constitutes a third connection conductor which extends into the aperture and beside the second zone adjoins a part of a further semiconductor zone situated within the edge of the aperture.

Since in this manner at least three and preferably all electric connections are produced via the same aperture, the semiconductor circuit element is particularly compact. Moreover, the semiconductor circuit element can simply be isolated from its direct surroundings if the third zone is constructed as a local zone which forms a p-n junction with the adjoining part of the semiconductor body, which junction separates the semiconductor circuit element from the remaining part of the semiconductor body. So, the semiconductor circuit element is particularly suitable for use in integrated circuits in which in particular a comparatively large packing density of circuit elements is achieved.

The semiconductor circuit element preferably is a bipolar transistor isolated from the adjoining part of the semiconductor body.

The electrically insulating layer is advantageously constructed as an oxide layer obtained by selective oxidation and sunk in the semiconductor body at least over a part of its thickness.

The method of manufacturing the semiconductor device described is characterized according to the invention in that a semiconductor body is provided at a surface with an electrically insulating layer having at least one aperture, that a semiconductor layer is deposited on the insulating layer and on the semiconductor surface within the aperture, that a first doping treatment is carried out in which a dopant is provided locally to obtain the second conductivity type doping in a first surface part of the semiconductor layer which is situated above the aperture and in an adjoining second surface part of the semiconductor layer which is situated above the insulating layer, the first surface part being chosen to be smaller than the whole surface part of the semiconductor layer situated above the aperture, and that a second doping treatment is carried out in which a dopant is provided locally to obtain the first conductivity type doping in a third surface part of of the semiconductor layer which is situated above the aperture and in an adjoining fourth surface part of the semiconductor layer which is situated above the insulating layer, the third surface part being smaller than and coinciding as a whole with a part of the first surface part.

The same dopant as provided in the third and the fourth surface parts is preferably provided during the second doping treatment in a fifth surface part of the semiconductor layer which is situated above the aperture and in an adjoining sixth surface part of the semiconductor layer which is situated above the insulating layer, in which of the third and fifth surface parts only the third part coincides as a whole with a part of the first surface part.

BRIEF DESCRIPTION OF THE DRAWING

The present invention will be described in greater detail, by way of example, with reference to a few embodiments and the accompanying drawing, in which:

FIG. 2 is an associated diagrammatic cross-sectional view of the same device taken on the line II—II of FIG. 1, and in which

DESCRIPTION OF THE PREFERRED EMBODIMENTS

Figure 1:
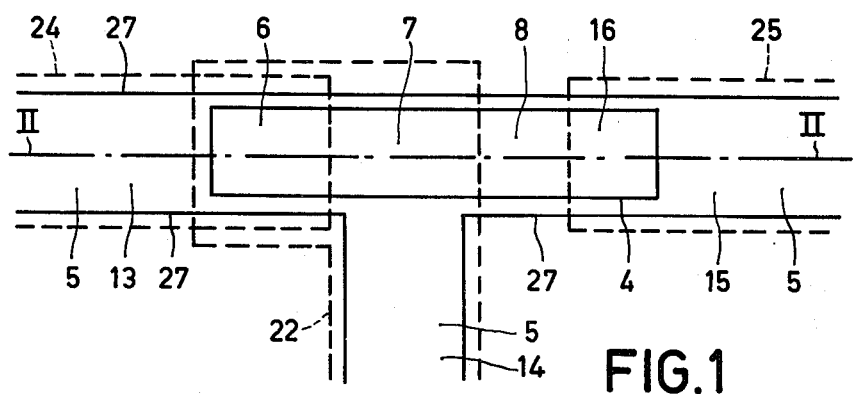
FIG. 1 is a diagrammatic plan view of a part of a first embodiment of the semiconductor device according to the invention.
Figure 2:
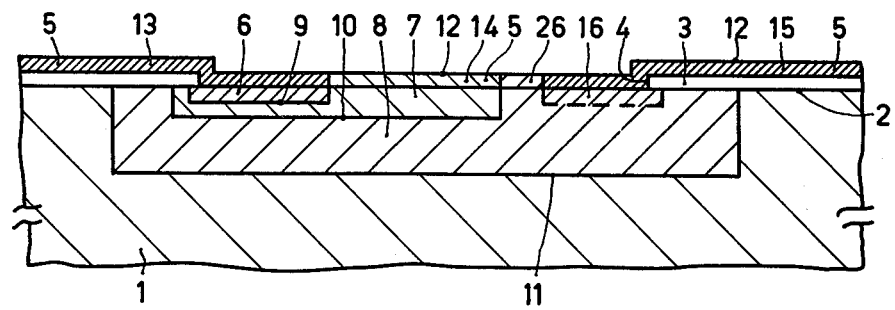

The first example relates to a semiconductor device of which FIGS. 1 and 2 show only a small part, namely the part which comprises a single transistor. This transistor may form part of an integrated semiconductor circuit together with similar transistors and other circuit elements, for example, diodes, resistors and capacitors.

The present example has a semiconductor substrate 1 of, for example, silicon in which an electrically insulating layer 3 having at least one aperture 4 is present at a surface 2 of the substrate 1. The insulating layer consists, for example, of silicon oxide or silicon nitride and may alternatively be constructed from a number of separate sub-layers of these materials. The substrate 1 consists mainly of p-type material having a resistivity of for example, 2 to 5 Ohm·cm.

A semiconductor layer 5 fully covering the part of the surface 2 of the substrate 1 situated within the aperture 4 extends on the insulating layer 3 and in the aperture 4. The layer 5 consists, for example, of silicon and has a thickness of, for example, 0.3 to 0.4 μm.

The device has a semiconductor circuit element with a first semiconductor zone 6 of a first conductivity type, an adjoining second semiconductor zone 7 of the second conductivity type, and a third semiconductor zone 8 of the first conductivity type adjoining the second zone 7. The circuit element is a transistor in which the first and third zones 6 and 8 are n-type zones and constitute the emitter and collector, respectively. The second zone 7 is a p-type zone and constitutes the base. The emitter-base p-n junction 9 is present between the zones 6 and 7 and the collector-base p-n junction 10 constitutes the boundary between the zones 7 and 8. The n-type collector 8 is further separated from the adjoining p-type part of the semiconductor substrate 1 by the p-n junction 11.

The transistor has a vertical structure, which means that, taken from the surface 12 of the semiconductor layer 5, the first zone 6 is situated on the second zone 7 and the second zone 7 in its turn is situated on the third zone 8.

The space which is occupied at the surface 2 is of direct importance not only for the packing density in integrated circuits, but also for the behaviour at higher frequencies. As the circuit element can be constructed to be smaller, for example, the parasitic capacitances can also be smaller. The size of the circuit element is usually also determined by the number of masks that have to be used during the manufacture, the number of different apertures which have to be provided and the way in which alignment tolerances have to be taken into account.

In the present example notably the aperture 4 is decisive of the required area or, in other words, is decisive of the lateral boundary of the occupied space.

The occupied space comprises the area in which the semiconductor zones 6–8 of the circuit element cooperate with each other. In the transistor described this area corresponds to the area in which during operation the actual transistor action is obtained. Outside this active area, however, usually some space is required in order to be able to provide one or more of the semiconductor zones with a connection conductor. In practice, the occupied space will nearly always be that space within which all rectifying junctions are present which are necessary for the operation of the semiconductor structure and possibly for its electrical isolation.

As already said, the aperture 4 is decisive of the occupied space. This need not mean that the occupied space is directly bounded by and coincides with the edge of the aperture. However, there does exist a direct relationship between the location of said edge and the location of the extreme boundary of the semiconductor structure in a lateral direction. In the present example the collector 8 is obtained in that doping is provided in the substrate 1 through the aperture 4. So, the intersection of the p-n junction 11 and the surface 2 accurately follows the edge of the aperture 4.

The semiconductor layer 5 has a first part 13 which is situated on the insulating layer 3, is of the first conductivity type, extends down to the aperture 4 and, as a connection conductor, adjoins a part of the first zone 6 situated within the edge of the aperture 4. The emitter zone 6 and the connection conductor 13 connected thereto are both n-type.

A second part 14 of the semiconductor layer 5 is also situated on the insulating layer 3, is of the second conductivity type and extends down to the aperture 4. As a connection conductor this part 14 adjoins a part of the second zone 7 situated within the edge of the aperture 4. The base zone 7 and the connection conductor 14 are hence both p-type.

According to the invention, a third connection is produced within the aperture 4. The second zone or base zone 7 situated on the third zone or collector 8 leaves a part of the third zone 8 exposed within the edge of the aperture 4. A third part 15 of the semiconductor layer 5 extends down to the edge of the aperture 4 and beside the second zone 7 adjoins a part of a further semiconductor zone situated within the edge of the aperture 4. In the present embodiment this further semiconductor zone is constituted by the third zone or collector 8 itself in which for improvement of the electrical contact an n-type contact zone 16 is provided in the aperture below the n-type connection conductor 15. The collector contact zone 16 has a higher doping concentration than the adjoining part of the collector 8.

The transistor described is particularly suitable for use in integrated circuits because all three connections are situated at the surface 2 and all the three semiconductor zones are isolated from the adjacent substrate region 1 by the p-n junction 11. Moreover, the transistor is particularly compact because all the connections are situated within the same aperture 4 which is provided in an early stage of the manufacture and is then covered by the semiconductor layer 5. In the two subsequent local doping treatments parts of the edge of the covered aperture 4 can hence be used as masking edges to help define the boundaries of zones 6 and 7 without these parts of the edge being etched initially during the steps involved in providing the bounding masks. As a result of this, the junctions 9 and 10 can be situated very close together, if necessary, also if the zones 6 and 7 are very thin. Tolerances have usually to be observed in particular in the case of very shallow diffusions at the edge where the p-n junctions emerge at the surface so as to prevent emitter-collector short-circuit from occurring. The known methods in which in principle doping is provided two times through the same non-covered aperture are substantially useless in very shallow diffusions because therein the edge of the aperture is always exposed to an etchant preceding the second doping treatment. This edge rather easily moves substantially up to or beyond the p-n junction obtained in the first doping treatment.

For the same reason, the aperture through which a shallow emitter zone was provided can usually not be used subsequently also as a contact aperture for the connection conductor. The danger exists that as a result of the movement of the edge of the aperture the connection conductor short-circuits the emitter-base junction.

Since in the present transistor parts of the semiconductor layer 5 are used for all the electric connections, the separate provision of contact apertures is entirely avoided. Moreover, the pattern of connection conductors, at least within the aperture 4 and/or the direct surroundings thereof, is obtained by local doping of the semiconductor layer 5 and not by etching as is more usual. As a result of this the connection conductors can be situated closer together. Notably within the aperture 4 the connection conductors may even adjoin each other and extend up to the p-n junctions without the danger of causing short-circuit. If necessary or desired, the connection conductors are separated from each other by p-n junctions or substantially intrinsic semiconductor material of the layer 5.

For the applicability of the semiconductor structure according to the invention it is of particular importance that more than two electrical connections can be realised in a simple manner within the aperture 4.

According to the invention, the transistor described can be manufactured as follows. It is to be noted, that a plurality of transistors can be manufactured simultaneously in the same semiconductor slice, said slice being finally severed into separate semiconductor devices, for example, by scribing and breaking. Also when the transistor described forms a part of an integrated circuit, it holds that several circuits can be manufactured in the same semiconductor slice.

Starting material is a monocrystalline body 1 of p-type silicon having a resistivity of, for example, 2–5 Ohm·cm. An electrically insulating layer is provided on the surface 2 of said body. For that purpose the body 1 is heated, for example, for approximately 60 minutes in moist oxygen at approximately 1100° C. The silicon oxide layer 3 which results has a thickness of approximately 0.5 $\mu$m. If desired, a layer of silicon nitride not shown in the figure may be provided on said layer 3, for example, by deposition from an atmosphere containing $NH_3$ and $SiH_2Cl_2$ at approximately 800° C. and reduced pressure. A suitable thickness for the silicon nitride layer to be provided in this or another known manner is, for example, approximately 0.1 $\mu$m.

An aperture 4 having dimensions, for example, of 4 $\mu$m × 15 $\mu$m is then provided in the insulating layer 3 in known manner, for example, by means of the known photolithographic etching methods. The aperture 4 is made, for example, by plasma-etching. With this method both the silicon nitride layer possibly present and the silicon oxide layer can be removed locally.

Silicon layer 5 is then deposited on the insulating layer 3 and in the aperture 4 on the semiconductor surface 2. This may be done for example, in known manner at low pressure and a temperature of approximately 650° C. The undoped layer 5 then is polycrystalline. The thickness of the layer 5 may be, for example, 0.4 to 0.5 $\mu$m.

An n-type dopant, for example, phosphorus, is then provided by implantation and/or diffusion in the layer 5 and through the layer 5 and the aperture 4 into the semiconductor body 1. The concentration and the heating times and heating temperatures are conventionally chosen such that after the further thermal treatments to be described n-type region 8 is formed in the body 1 having a depth of penetration of, for example, approximately 2 to 2.5 $\mu$m. This region 8 forms the p-n junction 11 with the adjoining p-type part of the body 1, the distance between said p-n junction and the surface 2 thus being 2 to 2.5 $\mu$m.

This doping treatment may be carried out without the use of a mask. The layer 5 then becomes entirely n-type. The provision of the doping may also be restricted to the aperture 4 and its direct surroundings, for example, by means of a photoresist mask (not shown) if the dopant is implanted in the layer 5 by means of ion implantation.

If the subsequent thermal treatment in which this dopant diffuses deeper in the semiconductor body is carried out entirely or partly in an oxidizing atmosphere, the semiconductor layer is covered with an oxide layer. This oxide layer (not shown) may be used as a masking layer in the subsequent doping treatments.

Figure 3:
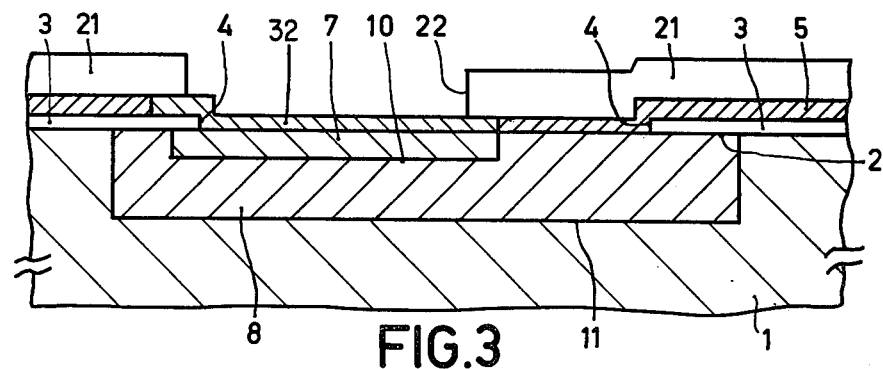
FIGS. 3 to 6 are diagrammatic plan views and cross-sectional views of this embodiment in various stages of its manufacture.
Figure 4:
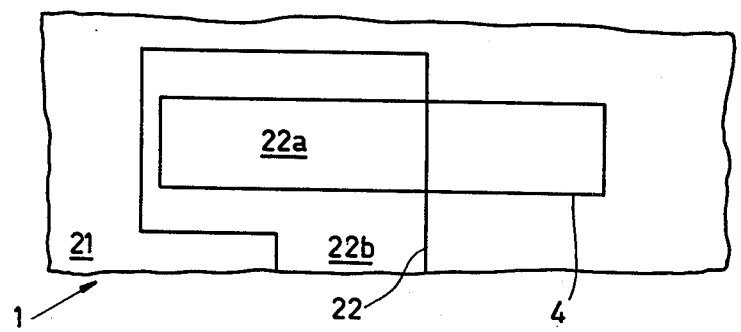

Before these doping treatments, a photoresist layer 21 is provided having therein an aperture 22 (FIGS. 3 and 4). This layer 21 serves as an etching mask for the underlying oxide layer on the semiconductor layer 5 and/or as a mask during an implantation treatment in which a p-type doping, for example consisting of boron ions, is provided. So, this dopant is locally provided in a first surface portion 22a of the semiconductor layer 5 which is situated above the aperture 4 and in an adjoining second surface portion 22b of the semiconductor layer 5 which is situated above the insulating layer 3, the surface portion 22a being chosen to be smaller than the aperture 4. The photoresist layer 21 is removed after the implantation. A thermal treatment is then carried out in which boron ions diffuse further in the layer 5 and/or in the zone 8, if desired in an oxidizing medium so that the resulting oxide layer may afterwards be used as a masking layer. Eventually a p-type part 32 of the layer 5 results which comprises base-connection conductor 14 (FIG. 1) and base zone 7 situated in the aperture 4 below this part 32. The base collector junction 10 is situated, for example, approximately 1 $\mu$m below the surface 2. Within the edge of the aperture 4 the sheet resistance of the layer 5 and the zone 7 together is, for example, approximately 200 to 300 Ohm per square. The part of the p-type part 32 situated on the insulating layer 5 then has, for example, a sheet resistance of approximately 600 to 800 Ohm per square.

Figure 5:
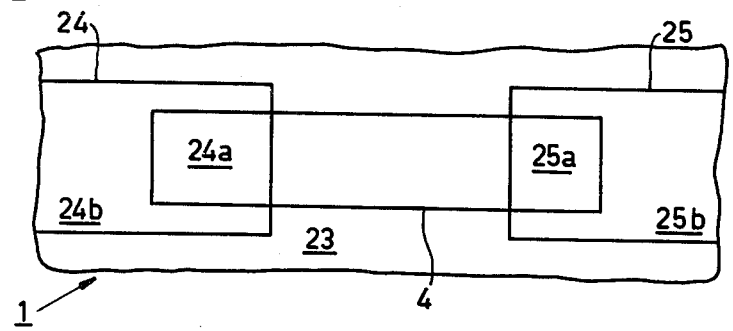

A photoresist layer 23 (FIGS. 5 and 6) is then provided again having therein two apertures 24 and 25, respectively. This layer 23 serves as a mask for an implantation of phosphorus ions. To obtain the first conductivity type (n-type) doping, phosphorus is provided locally in a third surface portion 24a of the semiconductor layer 5 which is situated above the aperture 4 and in an adjoining fourth surface portion 24b of the semiconductor layer 5 which is situated above the insulating layer 3, the third surface portion 24a being smaller than and coinciding entirely with a part of the first surface portion 22a in which previously the dopant boron was introduced to obtain the second conductivity type (p-type) doping.

Preferably, as in the present example, during one of the two last-mentioned treatments the relevant dopant is also provided locally in a fifth surface portion 25a of the semiconductor layer 5 which is situated above the aperture 4 and in an adjoining sixth surface portion 25b of the semiconductor layer 5 which is situated above the insulating layer 3, the two surface portions 24a and 25a situated above the aperture 4 being separated entirely from each other.

In this example the fifth and sixth surface portions 25a and 25b are exposed to a doping treatment simultaneously with the third and fourth surface portions 24a and 24b, in which of the third surface portion 24a and the fifth surface portion 25a only the third surface portion 24a coincides entirely with a part of the first surface portion 22a.

Figure 6:
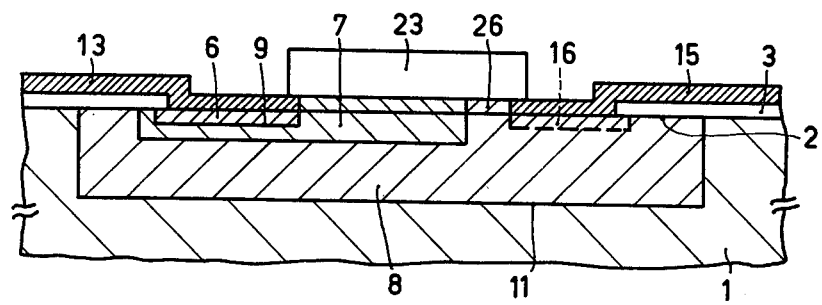

After the phosphorus implantation the photoresist layer 23 is removed and a thermal treatment is then carried out. The parts of the polycrystalline silicon layer 5 subjected to said implantation treatment are highly doped and have a sheet resistance of approximately 10 Ohm per square. Simultaneously, at the area where the apertures 4 and 24 overlap each other n-type emitter zone 6 situated within the base zone 7 is obtained below the silicon layer 5 (FIG. 6). The emitter-base p-n junction 9 is situated, for example, approximately 0.5 to 0.7 μm below the semiconductor surface 2. At the area where the apertures 4 and 25 overlap each other the n-type contact zone 16 also results below the silicon layer 5. The part 26 of the silicon layer 5 has been situated both below the masking layer 21 and below the masking layer 23. This part 26 has been doped only in the first doping treatment to obtain the collector zone 8 and thus consists of n-type silicon. The part 26 has a comparatively low n-type doping concentration.

The remaining part of the silicon layer 5 is also high-ohmic n-type or, if in the first doping treatment a mask has also been used, is undoped. This material is such a poor conductor that, if it is not removed, the comparatively highly doped parts 13, 14 and 15 often are already sufficiently insulated electrically from each other. If necessary, however, said electrical isolation can be improved by etching away the excessive parts of the silicon layer using a non-critical mask or converting them into oxide so that only the T-shaped part shown in FIG. 1 by the lines 27 remains intact. FIG. 1 also shows diagrammatically the location of the apertures 22, 24 and 25 in the masking layers 21 and 23.

Within the scope of the present invention it is of importance that it is usual to clean the exposed surface of the body 1 immediately preceding each doping treatment in which, for example, undesired traces of silicon oxide are removed. In this so-called dip-etching in a liquid in which silicon oxide dissolves, the edges of the aperture 4 could easily be initially etched if the aperture 4 and the silicon oxide layer 3 were not covered entirely by the polysilicon layer 5. Because it completely prevents the edges of the aperture 4 from being etched during this cleaning step in the present invention, very shallow base and emitter zones may also be used without any objection.

If the layer 5 is provided in known manner at a higher temperature such that the part situated within the edge of the aperture 4 grows epitaxially on the body 1 in the monocrystalline form, the emitter zone 6 may also be provided with such a small depth, for example, that the emitter-base junction 9 extends entirely in the layer 5.

In a modified embodiment of the example described an n-type doping is first provided in the semiconductor body 1 by implantation and/or diffusion, after the insulating layer 3 with the aperture 4 has been provided. This doping treatment serves to obtain the n-type region 8. After the surface has been cleaned, if necessary, the silicon layer 5 is then provided. The further doping treatments may then be carried out as was already described.

One of the advantages of the indicated change of the sequence in which the first doping treatment and the deposition of the semiconductor layer 5 are carried out is that the parts of the layer 5 which are masked in the doping treatments for the base zone and the emitter zone may remain undoped without an extra masking layer as described above being necessary therefore.

It is often no objection in this change of sequence that the edge of the aperture 4 is covered and protected only after the first doping treatment. The depth of penetration of the region 8 is usually comparatively large and at any rate larger than that of the base zone 7 and the emitter zone 6. As a result of this, the p-n junction 11 at the surface 2 is comparatively remote from the edge of the aperture 4. Usually, therefore, a small shift of the edge of the aperture after the first doping treatment to obtain the third zone 8 is still permissible.

Figure 7:
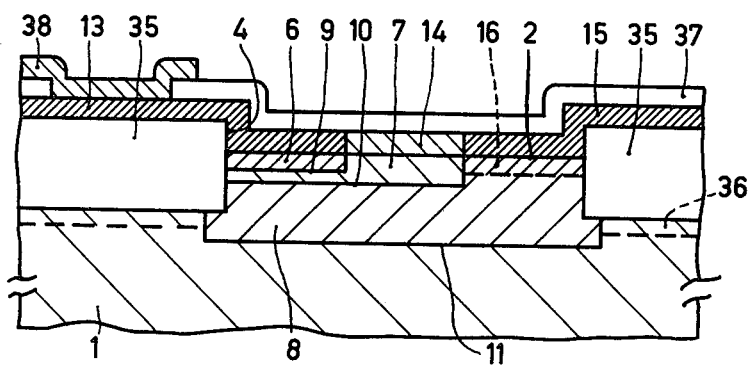
FIG. 7 is a diagrammatic cross-sectional view of a part of the second embodiment of the semiconductor device according to the invention.

The insulating layer 3 may also be replaced entirely or partly by an oxide pattern which is sunk in the semiconductor body over a part of its thickness or over its whole thickness. In semiconductor technology various methods are known with which such sunken oxide patterns can be obtained. FIG. 7 is a diagrammatic cross-sectional view, not drawn to scale, of a modified embodiment of the transistor according to the first example in which such a sunken oxide pattern 35 is used. In this figure corresponding parts are referred to by the same reference numerals as in FIG. 2. The oxide pattern 35 has been obtained by local oxidation of the body 1 in which a layer of, for example, silicon nitride masking against oxidation was used at the area of the aperture 4. If desired, a channel stopper 36 may be used below the oxide pattern 35, both of which can be provided in known manner.

In this example, the base zone 7 and the collector contact zone 16 are situated against each other at the surface 2, as well as the parts 14 and 15, respectively, of the semiconductor layer 5 which overlies the zones 7 and 16 and is provided across the oxide pattern 35 and in the aperture 4. As a result of this the dimensions of the transistor may be smaller than those of the first example. The use of the oxide pattern 35 also results in the dimensions of the transistor becoming smaller than in the first example.

In this connection it is to be noted that one of the known problems in using oxide layers obtained by selective oxidation over at least part of the thickness of a semiconductor body is that such oxide layers 35 may be very thin at the edge of the aperture 4 so that such an edge shifts particularly easily in subsequent etching or cleaning treatments. Therefore, in practice, a reasonable distance between the emitter zone 6 and the edge of the aperture 4 has often had to be observed so far so that the transistors occupy more space and/or extra process steps must be introduced to prevent problems such as the occurrence of short-circuits. When using the present invention, these problems do not occur or occur less rapidly, while a comparatively simple manufacturing process with comparatively few critical process steps will suffice.

The doped parts 13, 14 and 15 of the semiconductor layer, as well as the further parts of said semiconductor layer which are still present, are covered with an insulating layer 37 of, for example, silicon oxide and/or silicon nitride. A pattern of conductor tracks 38 of, for example, aluminium may be provided on said layer 37, in which the tracks 38, where necessary, may be connected to doped part, for example, the parts 13 of the semiconductor layer via apertures in the insulating layer 37. When the transistor described is used in integrated circuits, two levels of conductive connections are hence available between the circuit elements. The conductive connections at the first level consist of tracks of doped semiconductor material. If the polycrystalline semiconductor material present on the insulating layer 3 between these tracks is not removed or is converted into oxide, the comparatively large lateral diffusion of notably the phosphorus doping in said polycrystalline material should be taken into account. Within the aperture 4 the lateral diffusion in the semiconductor layer 5 is often considerably smaller than outside said aperture. Experiments performed in the scope of the present invention have demonstrated that the emitter and collector connection conductors 13 and 15 within the aperture 4 may be situated at a surprisingly short distance from each other without undesired connections being formed. It has been found that this distance may be significantly smaller than might be expected on the basis of the diffusion rate in polycrystalline layers known from literature. This permits the fabrication of circuit elements having extra small dimensions and electric connections adapted thereto.

In circuit arrangements, such as certain memories and various logic circuit arrangements the fact may advantageously be used that so-called polydiodes can simply be incorporated in the semiconductor tracks and may serve as switching elements in such circuits. No extra space at the surface is required for said polydiodes. They may be provided in parts of the polycrystalline semiconductor tracks situated on the insulating layer 5 or 35.

In the transistors described, the emitter-base junction 9 and the base-collector junction 10 continue from the crystalline body 1 into the polycrystalline semiconductor layer 5 provided thereon. So, a polydiode is parallel to each of these two p-n junctions of the transistor. This may have a detrimental influence on the properties of the transistor but also due to the comparatively small area of said polydiodes said detrimental influence is usually small and permissible for many applications. Moreover, by providing the semiconductor layer in suitably chosen circumstances in which inter alia the grain size and the thickness play a role, the detrimental influences of the polydiodes can be restricted. According as the lifetime of the free charge carriers in the polycrystalline semiconductor layer is larger, the properties of the polydiodes better correspond to those of the adjoining p-n junctions in the monocrystalline material. Depending on the growth conditions and the thickness of the layer, the monocrystalline structure at the semiconductor surface 2 exposed in the aperture 4 may have a favourable effect on the semiconductor layer part deposited within the aperture 4. Furthermore, during the thermal treatments associated with the doping treatments, crystallisation effects may occur which have a favourable influence on the properties of the polydiodes present in the aperture.

It will be obvious that the present invention is not restricted to the embodiments described but that many variations are possible to those skilled in the art without departing from the scope of this invention. For example, other semiconductor materials, such as germanium or $A_{III}B_V$ compounds, may be used. This applies both to the monocrystalline semiconductor body and to the semiconductor layer provided across the insulating layer and in the aperture. Furthermore, other geometrical shapes may be used. For example, the emitter zone 6 may extend in the aperture 4 as a strip, in which on both sides of the strip the base zone 7 extends up to the surface of the semiconductor layer. Other doping methods, for example diffusion from the gaseous phase or from a doped insulating layer as a source instead of the described implantation may also be used.

The semiconductor body 1 may consist of a comparatively heavily doped semiconductor substrate on which a less heavily doped semiconductor surface layer is provided or also of an insulating substrate, for example sapphire, having thereon an epitaxial semiconductor layer. In the latter case the collector zone 8 and/or the oxide pattern 35 may also extend entirely through the epitaxial semiconductor layer down to the insulating substrate.

Furthermore, the conductivity types in the examples described may be interchanged. Circuit elements other than transistors having three or more connections may be provided in the aperture. For example, if in the first example the aperture 25 is not provided in the masking layer 23 but in the masking layer 21 a second p-type zone is obtained instead of the n-type zone 16. As a result of this a lateral four-layer transistor (npnp) or, dependent on the operation, an npn-transistor which is provided with a complementary pnp-transistor for example for the supply of current to the base zone 7 is obtained.

The semiconductor circuit elements described in combination with similar and/or other circuit elements may form part of an integrated circuit. Therein the transistors according to the first and the second example may also be used in reversed direction, with the zone 6 as collector and the zone 8 as emitter.

Finally it is to be noted that the expression "polycrystalline semiconductor material" has been used here in the wide sense of "non-crystalline semiconductor material" and hence also comprises, for example, amorphous semiconductor material.

What is claimed is:

1. A method of manufacturing a semiconductor device in which: an electrically insulating layer with an aperture through it lies along an upper surface of a semiconductor body; a semiconductor layer on the insulating layer and on the entire section of the upper surface within the aperture has a first portion of a first conductivity type extending at least to the aperture, has a second portion of a second conductivity type opposite to the first conductivity type extending at least partway through the aperture, and has a third portion distinct from the first and second portions extending at least partway through the aperture to adjoin a specified part of the body; and a semiconductor circuit element has a first zone of the first conductivity type extending along a part of the aperture to adjoin the first portion, has a second zone of the second conductivity type at least partly in the body extending along at least a part of the aperture to adjoin the second portion and adjoining the first zone below it, and has a third zone of the first conductivity type in the body extending to the upper surface within the aperture, spaced apart from the first zone, and adjoining the second zone below at least part of the first zone; characterized by:

provinding the insulating layer with the aperture through it along the upper surface;

depositing semiconductor material on the insulating layer and in the aperture to form the semiconductor layer; and selectively introducing (1) a semiconductor dopant of the second conductivity type into a first part of the semiconductor layer occupying a segment of the aperture along its lateral edge and into an adjoining second part of the semiconductor layer above the insulating layer and (2) a semiconductor dopant of the first conductivity type into a third part of the semiconductor layer occupying a part of the segment along the lateral edge and into an adjoining fourth part of the semiconductor layer above the insulating layer.

2. A method as in claim 1 characterized by selectively introducing a selected one of the dopants into a fifth part of the semiconductor layer occupying another segment of the aperture along its lateral edge and into an adjoining sixth part of the semiconductor layer over the insulating layer, the fifth part being spaced apart from the particular one of the third part and the part of the first part excluding the third part into which the selected dopant is introduced.

3. A method as in claim 2 characterized in that the selected dopant enters a part of the body below the fifth part to define the specified part.

4. A method of manufacturing a semiconductor device comprising the steps of:

providing an electrically insulating layer with an aperture through it along an upper surface of a semiconductor body;

forming a semiconductor layer on the insulating layer and on the entire section of the upper surface within the aperture; and introducing (1) a first semiconductor dopant of a first conductivity type selectively into a unitary first section of the semiconductor layer overlying the insulating layer and occupying a selected part of a segment of the aperture, (2) a second semiconductor dopant of a second conductivity type opposite to the first conductivity type selectively into a unitary second section of the semiconductor layer overlying the insulating layer and occupying the segment and then into the body under the segment to a given depth therebelow, and (3) a third semiconductor dopant of the first conductivity type into the body through substantially all of the aperture to a depth therebelow greater than the given depth in such a manner that the semiconductor layer continues to adjoin substantially the entire section of the upper surface within the aperture and so as to define a semiconductor circuit element comprising (1) a first zone of the first conductivity type extending along a part of the aperture, (2) a second zone of the second conductivity type at least partly in the body extending along a part of the aperture and adjoining the first zone below it, and (3) a third zone of the first conductivity type in the body extending along a part of the aperture, spaced apart from the first zone, and adjoining the second zone below it.

5. A method as in claim 4 wherein: the first zone adjoins a part of the first section; and the second zone adjoins a part of the second section.

6. A method as in claim 5 further including the step of selectively introducing a fourth dopant of a selected one of the conductivity types into a unitary fourth section of the semiconductor layer overlying the semiconductor layer and occupying a second segment of the aperture spaced apart either from the selected part in the case where the selected conductivity type is the first conductivity type or from the segment in the case where the selected conductivity type is the second conductivity type.

7. A method as in claim 6 wherein the introduction of the first dopant into the semiconductor layer includes introducing it into the body to establish a fourth zone of the selected conductivity type below the second segment.

8. A method as in claim 7 wherein the selected conductivity type is the first conductivity type, the fourth dopant being the same as the first dopant and being simultaneously introduced with it into the semiconductor layer and the body.

9. A method as in claim 8 wherein the fourth zone is a part of the third zone having a greater net dopant concentration of the first conductivity type than the remainder of the third zone.

10. A method as in claim 4 wherein the introduction of the first dopant into the semiconductor layer includes introducing the first dopant into the body under the segment to a depth therebelow less than the given depth.

11. A method as in claim 10 wherein the introduction of the third dopant into the body includes introducing the third dopant into a unitary third section of the semiconductor layer occupying at least the aperture.

12. A method as in claim 11 wherein the lateral edges of the segment and its selected part inside the aperture are p-n junctions.

13. A method as in claim 4 wherein the introduction of the third dopant into the body is performed prior to the step of forming.

14. A method as in claim 13 wherein the step of forming comprises forming the semiconductor layer of substantially intrinsic semiconductor material, a portion of which substantially adjoins the material occupying the segment along its entire lateral edge inside the aperture after the introduction of the second dopant.

* * * * *

UNITED STATES PATENT AND TRADEMARK OFFICE
CERTIFICATE OF CORRECTION

PATENT NO. : 4,430,793
DATED : February 14, 1984
INVENTOR(S) : CORNELIS M. HART

It is certified that error appears in the above-identified patent and that said Letters Patent is hereby corrected as shown below:

Claim 6, line 3, delete "fourth";
line 4, change "semiconductor", second occurrence, to
-- insulating --

Signed and Sealed this

Third Day of July 1984

[SEAL]

Attest:

GERALD J. MOSSINGHOFF

Attesting Officer    Commissioner of Patents and Trademarks